United States Patent
Hosoda et al.

(10) Patent No.: US 11,018,403 B2
(45) Date of Patent: May 25, 2021

(54) ELECTROMAGNETIC WAVE TRANSMISSION CABLE INCLUDING A HOLLOW DIELECTRIC TUBE SURROUNDED BY A FOAMED RESIN MEMBER HAVING DIFFERENT EXPANSION RATIOS AT DIFFERENT REGIONS THEREIN

(71) Applicant: PIONEER CORPORATION, Tokyo (JP)

(72) Inventors: Yasuo Hosoda, Tokyo (JP); Tomoyuki Miyamoto, Tokyo (JP); Katsunori Obata, Tokyo (JP); Takahiro Togashi, Tokyo (JP); Takao Tagiri, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/465,497

(22) PCT Filed: Oct. 18, 2017

(86) PCT No.: PCT/JP2017/037700
§ 371 (c)(1),
(2) Date: May 30, 2019

(87) PCT Pub. No.: WO2018/100908
PCT Pub. Date: Jun. 7, 2018

(65) Prior Publication Data
US 2019/0296416 A1    Sep. 26, 2019

(30) Foreign Application Priority Data
Nov. 30, 2016    (JP) .............................. JP2016-232105

(51) Int. Cl.
*H01P 3/16* (2006.01)
*B32B 15/08* (2006.01)
(Continued)

(52) U.S. Cl.
CPC ................ *H01P 3/16* (2013.01); *B32B 15/08* (2013.01); *G02B 5/0278* (2013.01);
(Continued)

(58) Field of Classification Search
CPC ........... H01P 3/16; H01P 11/006; H01P 3/122
(Continued)

(56) References Cited

U.S. PATENT DOCUMENTS

| 3,444,487 A | 5/1969 | Krank et al. |
| 4,216,449 A * | 8/1980 | Kach ........................ H01P 3/16 333/236 |

(Continued)

FOREIGN PATENT DOCUMENTS

| GB | 2288469 A | 10/1995 |
| JP | H0196603 A | 4/1989 |

(Continued)

OTHER PUBLICATIONS

International Search Report for related International Application No. PCT/JP2017/037700 dated Jan. 23, 2018; English translation provided; 5 pages.

(Continued)

*Primary Examiner* — Benny T Lee
(74) *Attorney, Agent, or Firm* — Procopio, Cory, Hargreaves & Savitch LLP

(57) ABSTRACT

An electromagnetic wave transmission cable for transmitting an electromagnetic wave comprises a hollow waveguide tube and a foamed resin member. The hollowing waveguide tube includes a hollow dielectric layer formed in a tubular shape. The foamed resin member is provided over a predetermined length in a longitudinal direction of the hollow waveguide tube and covers a surface of the dielectric layer to surround an outer periphery of the hollow waveguide tube.

19 Claims, 10 Drawing Sheets

(51) Int. Cl.
  *G02B 5/02* (2006.01)
  *G02B 6/02* (2006.01)
  *G02B 6/032* (2006.01)
  *H01P 3/12* (2006.01)
  *H05K 9/00* (2006.01)
  *H01P 11/00* (2006.01)

(52) U.S. Cl.
  CPC ......... *G02B 6/02304* (2013.01); *G02B 6/032* (2013.01); *H01P 3/12* (2013.01); *H01P 3/122* (2013.01); *H05K 9/0071* (2013.01); *H01P 11/006* (2013.01)

(58) Field of Classification Search
  USPC .......................................................... 333/239
  See application file for complete search history.

(56) References Cited

U.S. PATENT DOCUMENTS

| | | | | |
|---|---|---|---|---|
| 4,441,091 | A * | 4/1984 | Nishida et al. ........ | H01O 13/20 333/242 |
| 5,221,308 | A | 6/1993 | Krohn et al. | |
| 2008/0025680 | A1* | 1/2008 | Sun et al. ................. | H01P 3/16 385/125 |
| 2009/0097809 | A1 | 4/2009 | Skorobogatiy et al. | |
| 2012/0075547 | A1 | 3/2012 | Aoyama et al. | |
| 2016/0064795 | A1* | 3/2016 | Chang et al. .......... | G02B 6/032 343/893 |
| 2016/0336996 | A1 | 11/2016 | Henry et al. | |
| 2016/0365175 | A1* | 12/2016 | Bennett et al. .......... | H04B 3/52 |
| 2018/0097269 | A1* | 4/2018 | Dogiamis et al. ...... | G06F 1/182 |

FOREIGN PATENT DOCUMENTS

| | | |
|---|---|---|
| WO | 2010/143335 A1 | 12/2010 |
| WO | 2016159314 A1 | 10/2016 |

OTHER PUBLICATIONS

Sun, B.-S. et al. "Characterization of Cylindrical Terahertz Metallic Hollow Waveguide with Multiple Dielectric Layers", Applied Optics, Oct. 20, 2012; pp. 7276-7285, vol. 51, No. 30; 10 apges.

Matsuura, Y. et al. "Hollow Waveguides for Delivery of Laser Light Energy" 1993; 10 pages; English translation provided.

Suzuki, T. et al. "Fabrication of Dielectric-Loaded Hollow Optical Fibers for Terahertz Wave-Evaluation by Time Domain Spectroscopy" IEICE, Sep. 20-23, 2016; 3 pages; English translation provided.

Hidaka, T. et al. "Ferroelectric PVDF Cladding Terahertz Waveguide" Journal of Lightwave Technology, Aug. 2005, pp. 2469-2473; vol. 23, No. 8; 4 pages.

European Search Report for related EP App. No. 17875524 dated Jun. 9, 2020; 7 pages.

Office action dated Mar. 2, 2021 in counterpart Japanese Patent Application No. 2020-029594.

* cited by examiner

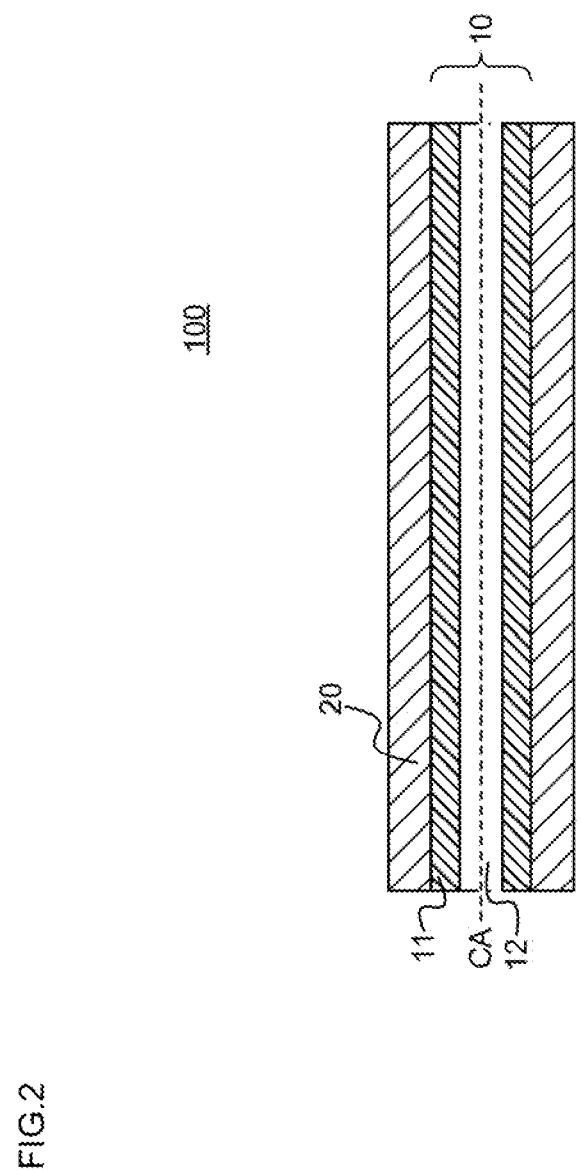

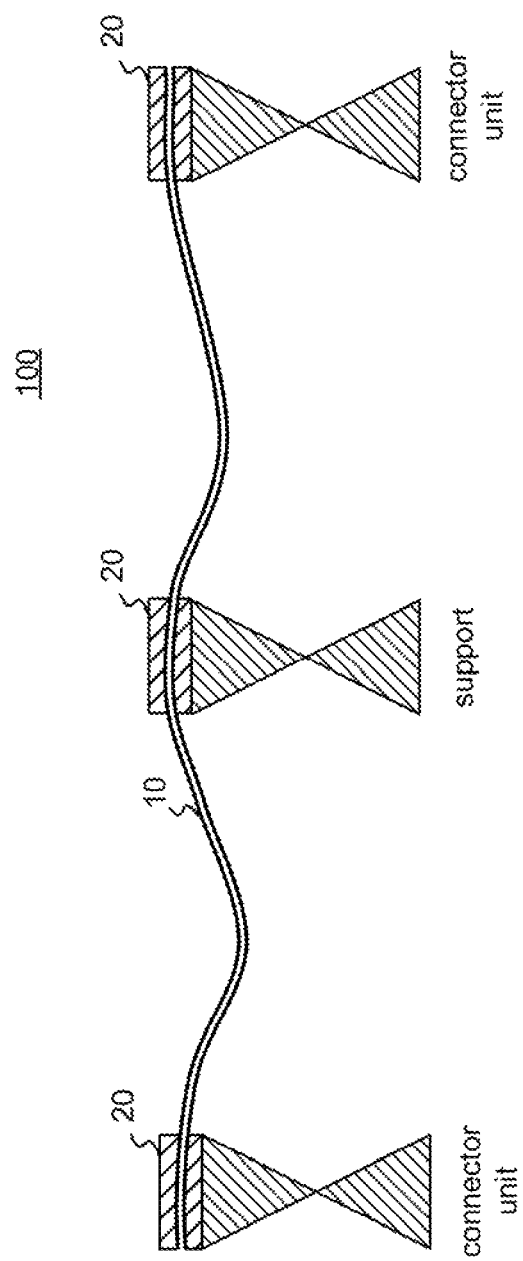

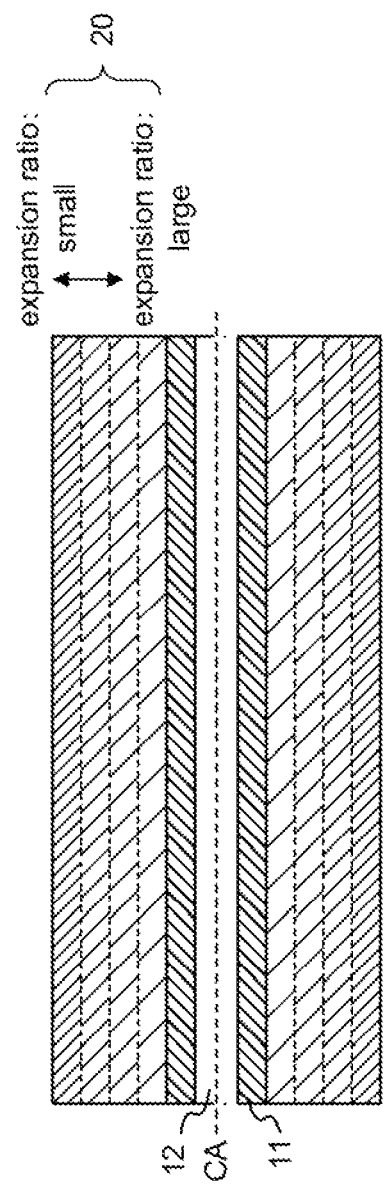

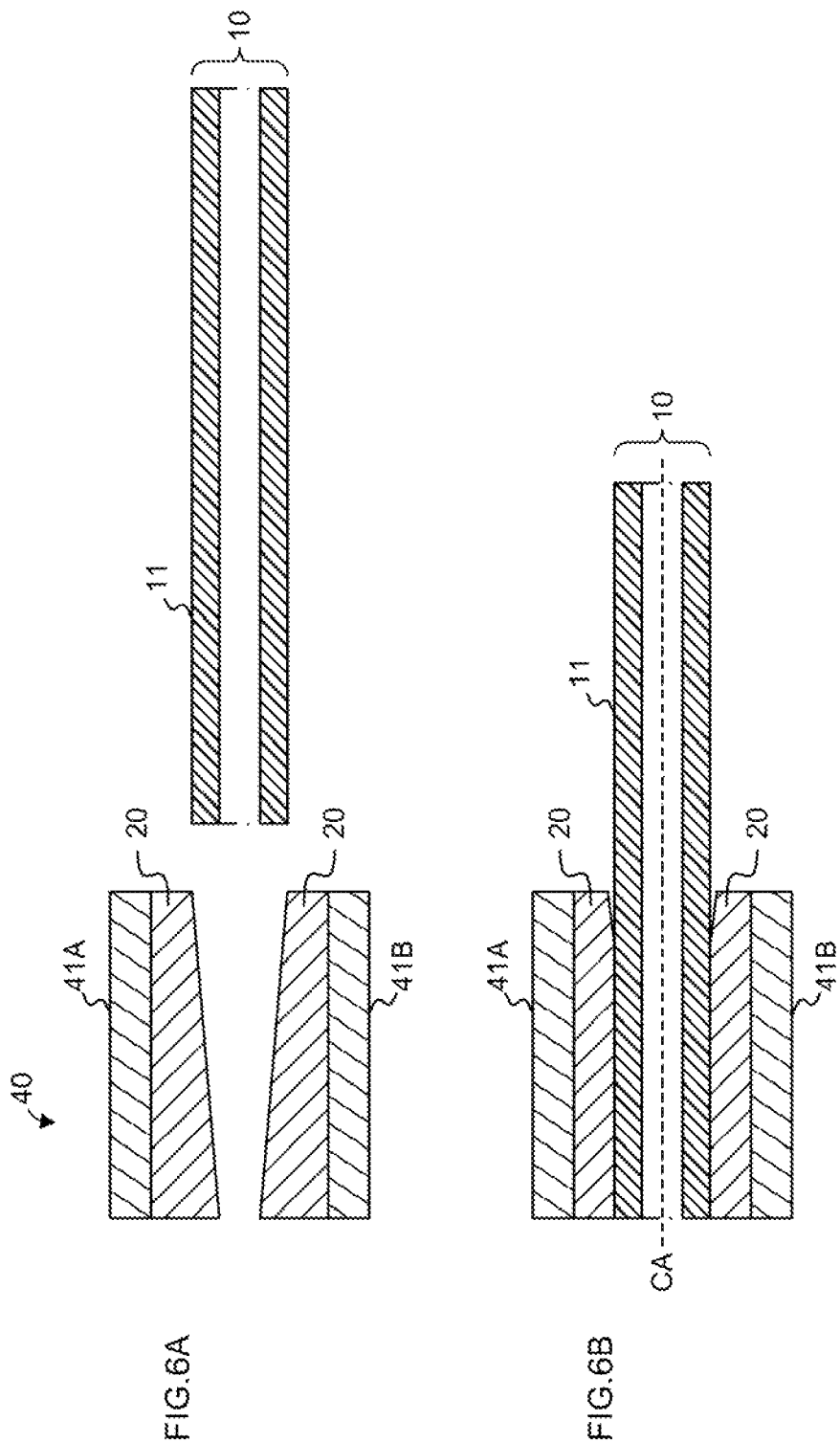

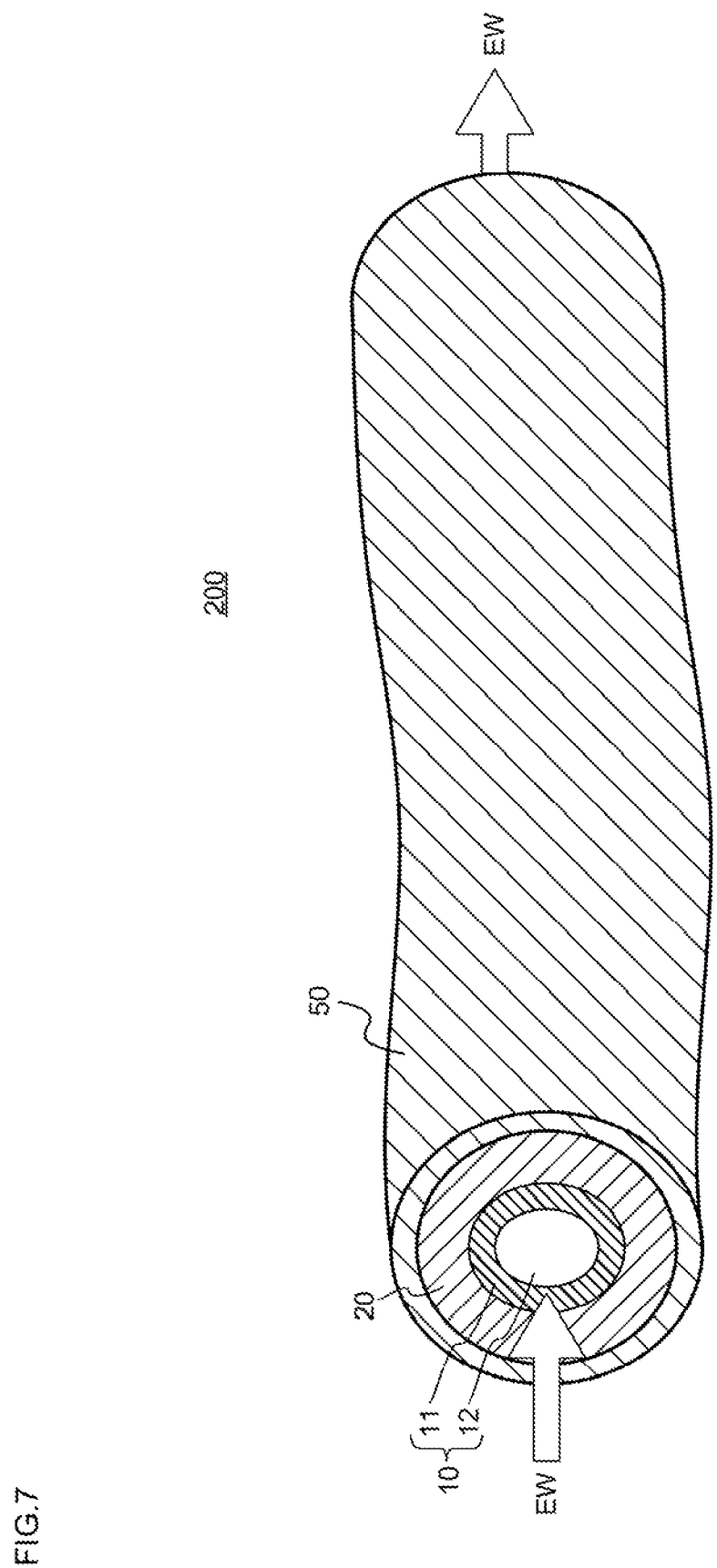

ELECTROMAGNETIC WAVE TRANSMISSION CABLE INCLUDING A HOLLOW DIELECTRIC TUBE SURROUNDED BY A FOAMED RESIN MEMBER HAVING DIFFERENT EXPANSION RATIOS AT DIFFERENT REGIONS THEREIN

CROSS-REFERENCE TO RELATED APPLICATIONS

This application is a U.S. National Stage entry of PCT Application No: PCT/JP2017/037700 filed Oct. 18, 2017, which claims priority to Japanese Patent Application No. 2016-232105, filed Nov. 30, 2016, the contents of which are incorporated herein by reference.

TECHNICAL FIELD

The present invention relates to an electromagnetic wave transmission cable.

BACKGROUND ART

A hollow waveguide tube made of a dielectric such as a resin has a light weight, high flexibility, a low transmission loss, and high transmission efficiency compared to metal cables such as a coaxial cable and metal waveguide tubes, and is thus effective as a cable for mainly transmitting millimeter waves (30 to 300 GHz) to THz-band (0.1 to 100 THz) electromagnetic waves.

While a hollow waveguide tube made of a single-layer dielectric tube has a confinement effect with respect to the surrounding air, the confinement effect can be hampered and electromagnetic waves can leak and scatter off the dielectric tube if a metal or another dielectric, such as a human body in particular, comes into contact with the outer wall of the waveguide tube.

A transmission path that confines and transmits electromagnetic waves by stacking two types of dielectrics in layers to construct a Bragg mirror on the outer periphery of a waveguide tube has thus been conceived (for example, Patent Literature 1).

CITATION LIST

Patent Literature

Patent Literature 1: United States Patent Application Publication No. 2009/0097809 published on Sep. 4, 2019.

SUMMARY OF THE INVENTION

Technical Problem

According to the foregoing conventional technique, different materials need to be stacked in layers to constitute the Bragg mirror. There have thus been problems of increased number of processes and high manufacturing cost. In addition, the thicknesses of the respective layers need to be designed on the basis of the wavelength of transmission, and there has been a problem of wavelength dependence.

Among examples of problems to be solved by the present invention is that the electromagnetic wave confinement effect is hampered when another object is in contact with the hollow waveguide tube.

Solution to the Problem

The invention is an electromagnetic wave transmission cable for transmitting an electromagnetic wave, comprising: a hollow waveguide tube including a hollow dielectric layer formed in a tubular shape; and a foamed resin member that is provided over a predetermined length in a longitudinal direction of the hollow waveguide tube and covers a surface of the dielectric layer to surround an outer periphery of the hollow waveguide tube.

BRIEF DESCRIPTION OF THE DRAWINGS

FIG. 2 is a longitudinal cross-sectional view of the electromagnetic wave transmission cable according to the present invention.

FIG. 4 is a diagram schematically showing a modification of the electromagnetic wave transmission cable according to the present invention.

FIG. 5 is a longitudinal cross-sectional view showing a modification of the electromagnetic wave transmission cable according to the present invention.

FIGS. 6A and 6B are longitudinal cross-sectional views showing a modification of the electromagnetic wave transmission cable according to the present invention.

FIG. 7 is a diagram schematically showing an electromagnetic wave transmission cable according to a second embodiment.

DETAIL DESCRIPTION OF PREFERRED EMBODIMENTS

Figure 1:
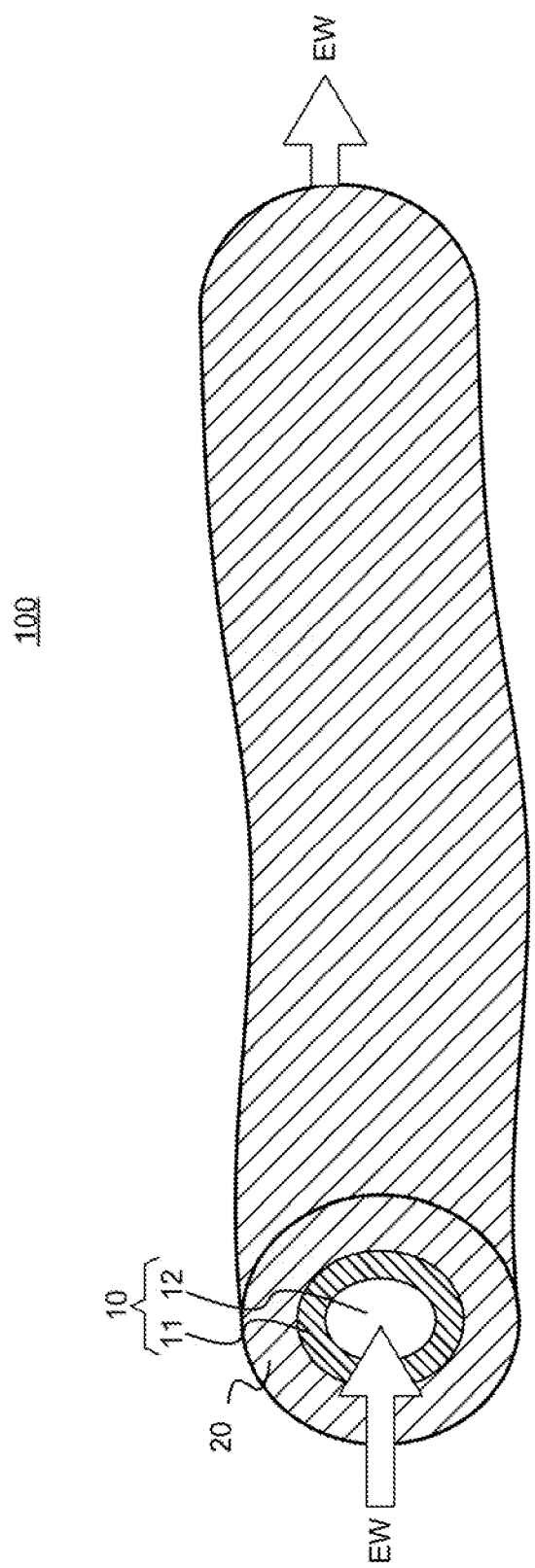
FIG. 1 is a diagram schematically showing an electromagnetic wave transmission cable according to the present invention.

Embodiments of the present invention will be described below with reference to the drawings. In the following description and the accompanying drawings, substantially the same or equivalent parts are designated by the same reference numerals.

First Embodiment

FIG. 1 is a diagram schematically showing a configuration of an electromagnetic wave transmission cable 100 according to the present embodiment. The electromagnetic wave transmission cable 100 includes a hollow waveguide tube 10 including a hollow dielectric layer in which a waveguide of tubular shape is formed, and a foamed resin member 20 covering the outside surface of the hollow waveguide tube 10. The dielectric layer and the hollow portion of the hollow waveguide tube 10 form a waveguide for transmitting electromagnetic waves EW.

FIG. 2 is a longitudinal cross-sectional view of the electromagnetic wave transmission cable 100. The hollow waveguide tube 10 includes a dielectric layer 11 and a hollow region 12.

The dielectric layer 11 is formed in a tubular shape to surround the hollow region 12 with a center axis at the center thereof. In other words, the dielectric layer 11 has a C rotationally symmetrical shape about the center axis CA. For example, FIG. 1 shows a case where the cross section of the dielectric layer 11 in a direction perpendicular to the center axis CA has a circular outer rim, whereas the outer rim may have an oblong circular shape, an elliptical shape, a rectangular shape, etc. The dielectric layer 11 is made of a fluorocarbon resin PTFE (polytetrafluoroethylene), for example. The dielectric layer 11 thus has a refractive index of approximately 1.5.

The hollow region 12 is formed in a rotationally symmetrical shape about the center axis CA along the inner diameter of the hollow waveguide tube 10 (i.e., the inner diameter of the dielectric tube made of the dielectric layer 11). Note that the dielectric waveguide does not necessarily need to have a rotationally symmetrical shape as long as desired performance is obtained. For example, while FIG. 1 shows a case where the cross section of the hollow region 12 (i.e., the cross section of the waveguide) in a direction perpendicular to the center axis CA is circular, the cross section may have an oblong circular shape, an elliptical shape, a rectangular shape, etc.

There is a close relationship between the wavelength of the electromagnetic waves EW flowing through the hollow waveguide tube 10 and an optimum tube shape. For example, to enhance adherence to the HE11 mode of low transmission loss, the inner diameter of the hollow waveguide tube 10 is desirably set to be smaller than the wavelength. On the other hand, the inner diameter of the hollow waveguide tube 10 is desirably set to be greater than the half-wavelength since the electromagnetic wave confinement effect weakens as the hollow region 12 decreases. The inner diameter of the hollow waveguide tube 10 according to the present embodiment is therefore set to be equal to or greater than the half-wavelength and not greater than the wavelength.

The outer diameter of the hollow waveguide tube 10 is desirably greater than a wavelength equivalent (wavelength×refractive index). On the other hand, to make the transmission in the HE11 mode dominant, the outer diameter of the hollow waveguide tube is desirably set to be not so large. Specifically, the outer diameter is desirably set to be less than or equal to twice an equivalent wavelength. The outer diameter of the hollow waveguide tube 10 according to the present embodiment is therefore set to be equal to or greater than the equivalent wavelength and not greater than twice equivalent wavelength equivalent.

To enhance the adherence to the HE11 mode of low transmission loss, the thickness of the dielectric layer 11 of the hollow waveguide tube 10 is desirably set to be smaller than the wavelength. However, since a dielectric layer 11 that is too thin fails to provide strength needed for supporting the waveguide, the thickness of the dielectric layer 11 is desirably set to be greater than 1/10 of the wavelength. The thickness of the dielectric layer 11 according to the present embodiment is therefore set to be equivalent to or greater than 1/10 of the wavelength and not greater than one wavelength.

The foamed resin member 20 extends in the longitudinal direction of the hollow waveguide tube 10 (i.e., waveguide direction) and covers the outside surface of the dielectric layer 11 (i.e., surface opposite from the hollow region 12) to surround the outer periphery of the hollow waveguide tube 10 with the center axis CA of the hollow waveguide tube 10 at the center. The foamed resin member 20 in its simplest form has a rotationally symmetrical cross-sectional shape about the center axis CA of the hollow waveguide tube 10. However, the foamed resin member 20 may have any shape as long as desired performance is obtained. For example, while FIG. 1 shows a case where the cross section of the foamed resin member 20, in the direction perpendicular to the center axis CA, has a circular outer rim, the outer rim may be an oblong circle, an ellipse, a rectangular, etc. The outer rim of the cross section of the foamed resin member 20 may have the same shape as or a different shape from that of the outer rim of the cross section of the dielectric layer 11.

For example, the foamed resin member 20 is made of foamed polystyrene. Foamed polystyrene has a fine intricate structure of polystyrene having a refractive index of 1.6 compared to air having a refractive index of 1, and includes a lot of fine reflection interfaces between polystyrene that is the dielectric and air. For example, low-expansion-ratio foamed polystyrene used as a packaging material was measured in a bulk state and found to have an average refractive index (refractive index based on the assumption that the bulk material was a uniform medium of a single substance) of approximately 1.1 at 0.1 to 0.5 THz. This result demonstrates that a large amount of air is mixed in foamed polystyrene.

As described above, the foamed resin member 20 contains a large amount of air, and the ratio of polystyrene which is in contact with the surface of the hollow waveguide tube 10 is extremely low. This can significantly reduce the leakage of electromagnetic waves even in situations where a metal, a human body, or the like comes into contact with the outside surface of the foamed resin member 20 (i.e., surface opposite from the surface which is in contact with the hollow waveguide tube 10).

A thickness of the foamed resin member 20 which is too small lowers the electromagnetic wave confinement effect. For example, in an experiment performed by using a PTFE hollow waveguide tube having a waveguide frequency of 300 GHz, an outer diameter of 0.9 mm, and an inner diameter of 0.5 mm, a sufficient effect was not obtained if the thickness of the foamed resin member 20 was less than 1 mm. The thickness of the foamed resin member 20 (thickness of the covering portion) is therefore desirably set to be greater than or equal to a thickness equivalent to the wavelength of the electromagnetic waves to be transmitted (wavelength×average refractive index). Since a thickness that is too great results in poor handleability, the thickness of the foamed resin member 20 is desirably set to 50 mm or less, preferably 10 mm or less.

As described above, in the electromagnetic wave transmission cable 100 according to the present embodiment, the surface of the hollow waveguide tube 10 is covered with the foamed resin member 20. The foamed resin member 20 contains a large amount of air and has an average refractive index lower than the refractive index of the dielectric layer 11 of the hollow waveguide tube 10.

With such a configuration, the electromagnetic wave confinement effect of the hollow waveguide tube 10 can be maintained even in situations where a metal, human body, or other object comes into contact therewith.

The embodiment of the present invention is not limited to the foregoing embodiment. For example, in the foregoing embodiment, the foamed resin member 20 is described to be made of foamed polystyrene. However, the material of the foamed resin member 20 is not limited thereto, and the foamed resin member 20 may be made of foamed polyurethane, foamed polyolefin (foamed polyethylene, foamed polypropylene), foamed polytetrafluoroethylene (PTFE), or the like.

If the outer diameter of the hollow waveguide tube 10 is smaller than the equivalent wavelength (i.e. wavelength× refractive index), there occurs a wave component propagating over the outer periphery of the waveguide tube. This can cause an adverse effect if the covering foamed resin has an attenuation factor higher than that of air. If the material of the foamed resin member 20 is polystyrene (PS), polyethylene (PE), or fluorocarbon resin (PTFE), the foamed material has an average attenuation factor of 0.1 cm-1 or less, and such adverse effects are less likely to occur.

In the foregoing embodiment, the foamed resin member 20 is described to be made of foamed polystyrene and has an average refractive index of approximately 1.1 at 0.1 to 0.5 THz, for example. However, the average refractive index of the foamed resin member 20 is not limited thereto. Since the electromagnetic wave confinement effect results from a low refractive index, the foamed resin member 20 desirably has a high expansion ratio. However, an expansion ratio that is too high increases softness and results in poor handleability. The foamed resin member 20 is therefore desirably foamed to an extent such that the average refractive index in the transmission frequency band in a bulk state falls below 1.4.

Unlike the foregoing embodiment, the dielectric layer 11 of the hollow waveguide tube 10 and the foamed resin member 20 may be made of the same type of material by using a foam of foamed fluorocarbon resin (polytetrafluoroethylene) (PTFE) as the material of the foamed resin member 20. In other words, the hollow waveguide tube 10 and the foamed resin member 20 can be constituted by changing the expansion ratio of the same material.

Figure 3A:
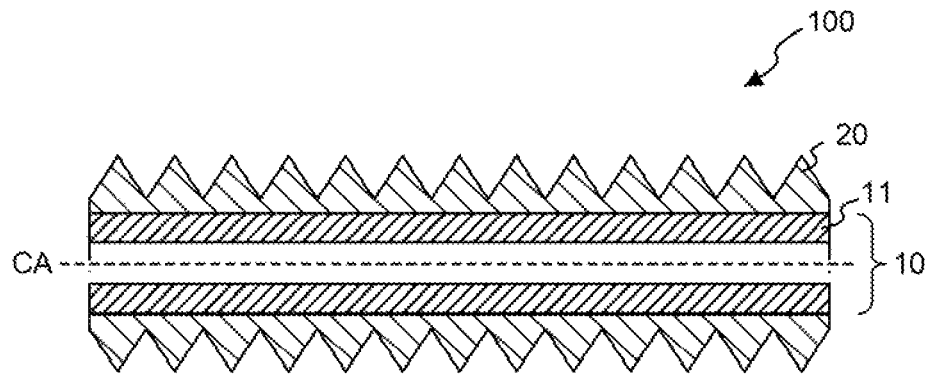
FIGS. 3A, 3B, and 3C are a longitudinal cross-sectional views showing modifications of the electromagnetic wave transmission cable according to the present invention.
Figure 3B:
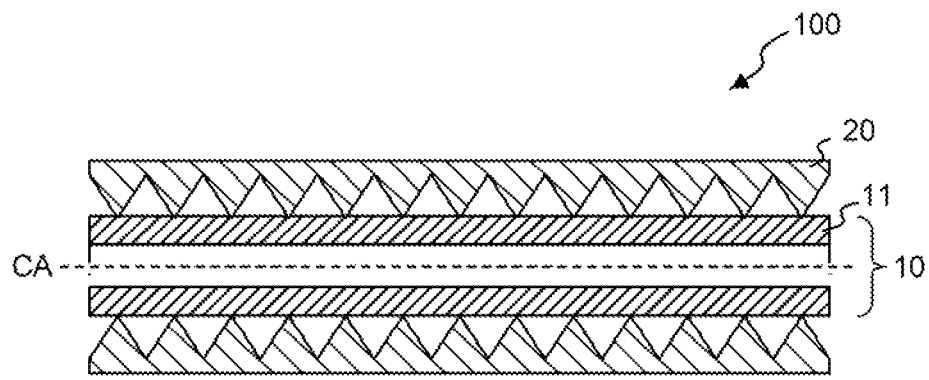

A three-dimensional structure may be formed on the surface of the foamed resin member 20. For example, the electromagnetic wave transmission cable 100 can be made flexible by forming a protruding structure on the outside surface opposite from the inside surface that is in contact with the dielectric layer 11 as shown in FIG. 3A. The electromagnetic wave confinement effect can be enhanced by forming a protruding structure on the inside surface that is in contact with the dielectric layer as shown in FIG. 3B. The three-dimensional structure formed on the surface(s) of the foamed resin member 20 may have a notch shape or other pit-and-projection shape.

Figure 3C:
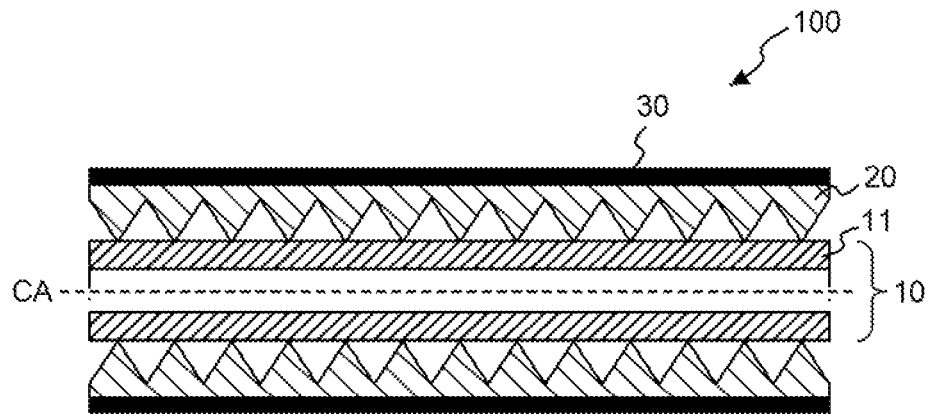

To protect the hollow waveguide tube 10 and the foamed resin member 20 from collapsing, as shown in FIG. 3C, an outer coating 30 covering the outside surface of the foamed resin member 20 may be provided along the longitudinal direction of the hollow waveguide tube 10 and the foamed resin member 20.

As shown in FIG. 4, instead of covering the entire hollow waveguide tube 10 with the foamed resin member 20, only parts that can come into contact with other members, such as connector units for connecting waveguide tubes to each other and supports for holding the waveguide tube(s) at a predetermined height, may be configured to be covered with the foamed resin member 20. In other words, the foamed resin member 20 may be formed over a predetermined length (distance) in the longitudinal direction of the hollow waveguide tube, and may be provided at a plurality of positions.

As shown in FIG. 5, the expansion ratio of the foamed resin member 20 may be changed stepwise between regions closer to a contact surface that is in contact with the dielectric layer 11 (i.e., inside) and regions farther from the contact surface (i.e., outside). For example, in the inside regions closer to the contact surface with the dielectric layer 11, the expansion ratio can be increased (i.e. large) to reduce the refractive index and enhance the electromagnetic wave confinement effect. In the outside regions farther from the contact surface with the dielectric layer 11, the expansion ratio can be reduced (i.e. small) to increase cable rigidity. This can be implemented, for example, by dividing the regions closer to and farther from the contact surface of the foamed resin member 20 with the dielectric waveguide 10 into a plurality of areas, and reducing the expansion ratios of the respective areas stepwise from the areas closer to the contact surface to the farther areas.

As shown in FIGS. 6A and 6B, a foamed resin member 20 can be used as a connector 40 (FIG. 6A) in a connector unit for connecting waveguide tubes to each other. For example, as shown in FIG. 6A, by utilizing the property of the foamed resin member 20 being deformable, foamed resin members 20 are provided on the inner sides of a pair of holding members 41A and 41B to form a tapered gap. As shown in FIG. 6B, the hollow waveguide tube 10 can thus be inserted into the connector 40 so that the hollow waveguide tube is supported. This enables easy and reliable cable positioning while preventing the electromagnetic wave confinement effect from being hampered by contact with the holding members 41A and 41B.

In the electromagnetic wave transmission cable 100 according to the present embodiment, the dielectric layer 11 may be made of e-PTFE (expanded polytetrafluoroethylene) which is PTFE formed by stretch processing. Note that e-PTFE can be obtained, for example, by stretching a PTFE material at least in one direction to provide continuous porosity (i.e. structure including a large number of continuous pores) and then sintering-fixing (i.e. fixing by sintering) the resultant material at high temperature. The stretched porous resin (e-PTFE) used in the present embodiment has characteristic fine nodes and fine fiber structures in the stretching direction, and can thus function as a medium having a low average refractive index without increasing the electromagnetic wave transmission loss.

The porosity of the stretched porous resin (the proportion of porous portions in the resin) can be selected from among 30% to 90% depending on the intended use. To cover the outside with the foamed resin member 20 as in the present embodiment, there needs to be a refractive index difference within the foamed resin member 20. To suppress the electromagnetic wave transmission loss, a refractive index difference of at least 0.01 or so is need. The desirable porosity derived therefrom is 70% or less. The optimum range of the porosity of the stretched porous resin of the dielectric layer 11 according to the present embodiment is therefore 30% to 70%.

Second Embodiment

FIG. 7 is a diagram schematically showing a configuration of an electromagnetic wave transmission cable 200 according to the present embodiment. The electromagnetic wave transmission cable 200 includes a hollow waveguide tube 10 including a hollow dielectric layer 11 in which a waveguide of tubular shape is formed, a foamed resin member 20 covering the outside surface of the hollow waveguide tube 10, and a metal film 50 covering the outside surface of the foamed resin member 20.

Figure 8A:
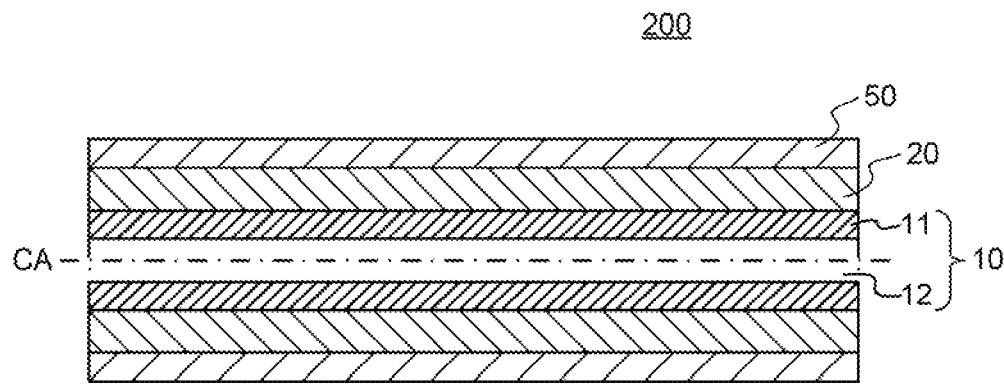
FIGS. 8A, 8B, and 8C are longitudinal cross-sectional views of the electromagnetic wave transmission cable according to the second embodiment.

FIG. 8A is a longitudinal cross-sectional view of the electromagnetic wave transmission cable 200. The hollow waveguide tube 10 includes a dielectric layer 11 and a hollow region 12.

The dielectric layer 11 is made of a resin material having a low refractive index or a low complex refractive index, such as PTFE (polytetrafluoroethylene), e-PTFE (expanded polytetrafluoroethylene) formed by stretching PTFE to provide continuous porosity and fixing the same by sintering, and PE (polyethylene). To reduce a transmission loss, the tube (i.e. dielectric layer 11) desirably has a small thickness.

The foamed resin member 20 is arranged to surround the outer periphery of the hollow waveguide tube 10. The foamed resin member 20 needs to have a refractive index lower than that of the dielectric constituting the dielectric layer 11 of the hollow waveguide tube 10. The closer to 1 the refractive index is, the better.

The foamed resin member 20 is formed on the outer peripheral surface of the hollow waveguide tube 10, for example, by a method of inserting the hollow waveguide tube 10 into the inside of a foamed resin of hollow shape, a method of winding foamed resin around the hollow waveguide tube 10, or other methods.

Like the hollow waveguide tube 10 and the foamed resin member 20, the metal film 50 has a rotationally symmetrical shape about the center axis CA. The metal film 50 extends in the longitudinal direction of the hollow waveguide tube 10 and the foamed resin member 20, and further covers the outside surface of the foamed resin member 20 covering the hollow waveguide tube 10 to surround the outer periphery of the foamed resin member 20 with the center axis CA at the center. Note that the metal film 50 may have any shape as long as desired performance is obtained. While FIG. 7 shows a case where the cross section of the metal film 50, in a direction perpendicular to the center axis CA, has a circular outer rim, the outer rim may be an oblong circle, an ellipse, a rectangular, etc. The outer rim of the cross section of the metal film 50 may have the same shape as or a different shape from that of the cross section of the hollow waveguide tube 10 or the foamed resin member 20. In other words, the metal film 50 may have any shape covering the foamed resin member 20.

The metal film 50 is made of a metal having a relatively high conductivity, such as gold, silver, and copper. The metal film 50 may have a thickness of about 1 μm or more. The metal film 50 is formed, for example, by a method of directly forming a metal film on the surface of the foamed resin member 20, a method of forming a metal film on the surface of a dielectric sheet to fabricate a metal-coated sheet in advance and then winding the metal-coated sheet on the foamed resin member 20 with the metal surface toward the foamed resin member 20, or other methods.

Figure 8B:
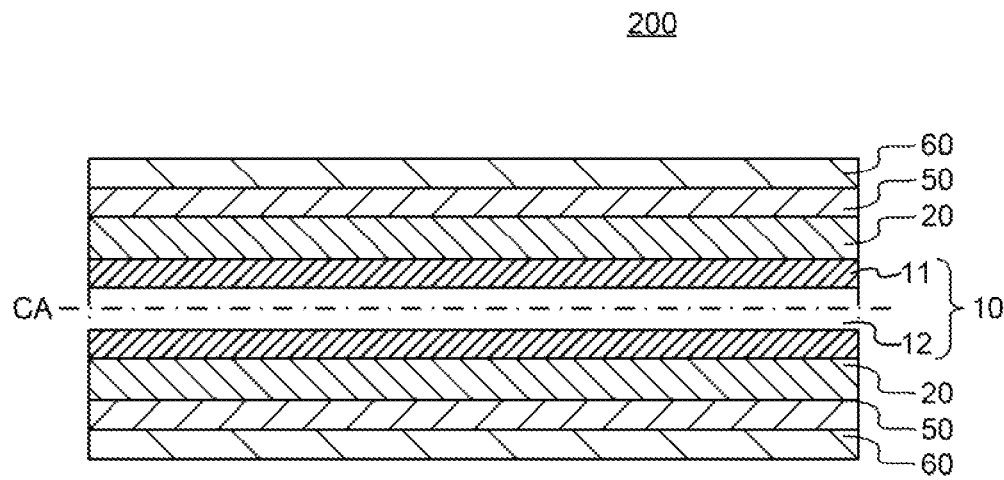

The outer peripheral portion of the metal film 50 is actually covered with a protective film 60 made of a dielectric or the like, as shown in FIG. 8B. The protective film has only a protective function and does not contribute to electromagnetic wave transmission. For example, if the metal film 50 is formed by the method of winding a metal-coated sheet on the foamed resin member 20, the dielectric sheet can be left unremoved and used as a protective film.

As described above, in the electromagnetic wave transmission cable 200 according to the present embodiment, the metal film 50 is formed to further cover the outside surface of the foamed resin member 20 covering the hollow waveguide tube 10. The effect of the metal film 50 will be described with reference to FIGS. 9 and 10.

Figure 9:
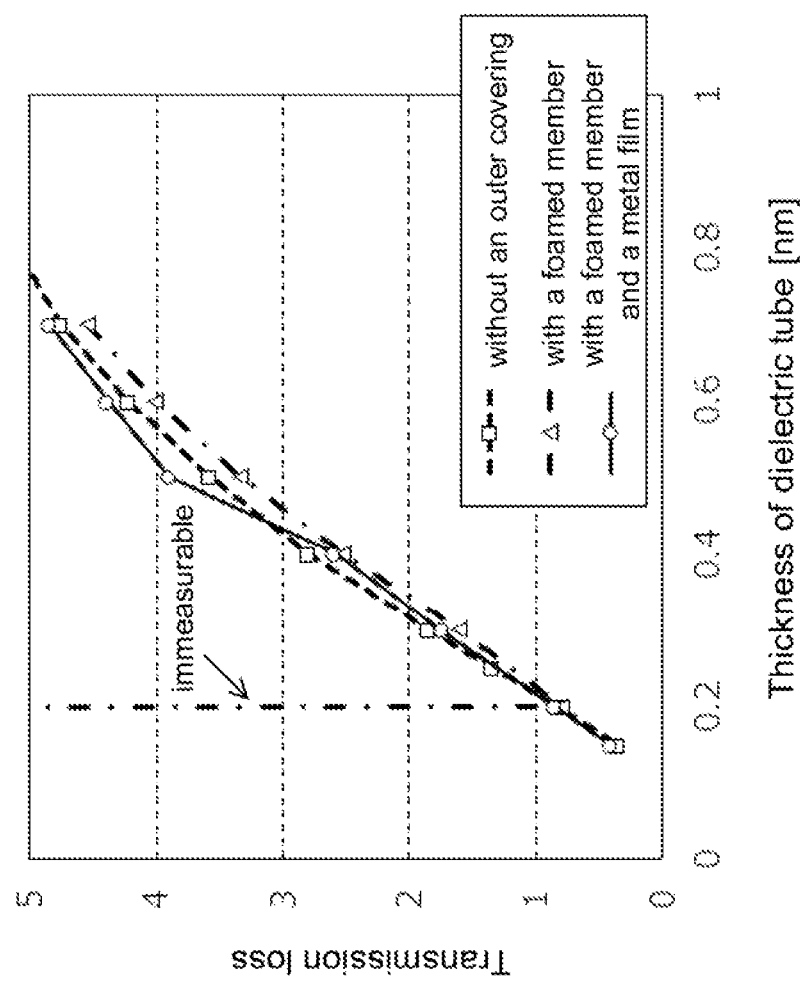
FIG. 9 is a chart showing an example of a relationship between the presence or absence of an outer covering and a transmission loss.

FIG. 9 is a graph showing a relationship between the thickness in nm of the dielectric layer 11 (dielectric tube) made of e-PTFE and the transmission loss, depending on the presence or absence of the outer covering.

If the hollow waveguide tube is formed alone without any outer covering, as shown by a broken line in FIG. 9, the transfer or transmission loss decreases as the thickness of the dielectric layer decreases (dielectric tube becomes thinner).

Figure 10:
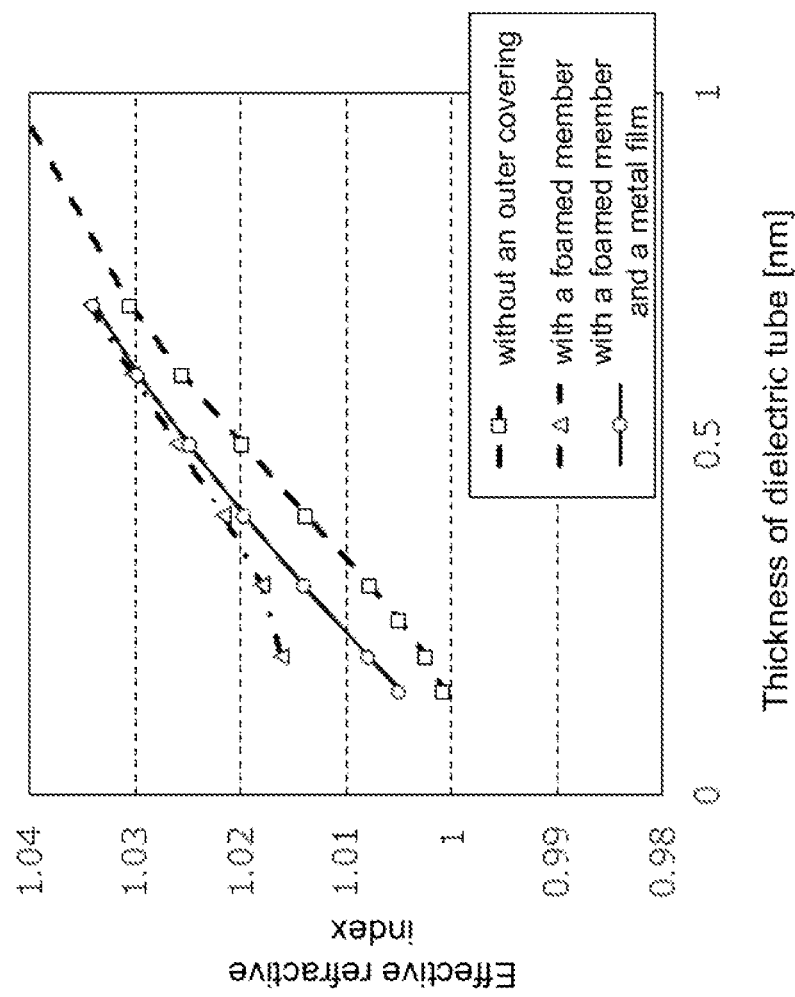
FIG. 10 is a chart showing a relationship between the presence or absence of the outer covering and an effective refractive index.

If the outside surface of the dielectric layer of the hollow waveguide tube is covered with a foamed polystyrene resin having an expansion ratio of approximately 30 times, as shown by a dot-dashed line in FIG. 9, the transmission loss is lower than without an outer covering, and the transmission loss decreases with the decreasing thickness of the dielectric layer within a range where the dielectric layer (dielectric tube) has a certain thickness or more (in FIG. 10, approximately 0.2 mm to 0.7 mm). However, if the thickness of the dielectric layer falls below a certain value (0.2 mm), the transmission loss degrades to a nontransmissible degree (in FIG. 9, shown as immeasurable).

In contrast, if the outside surface of the foamed resin covering the hollow waveguide tube is further covered with a metal film, as shown by a solid line in FIG. 9, the transmission loss decreases in proportion to the thickness of the dielectric layer. The transmission loss does not degrade even in the range where the thickness of the dielectric layer is less than the certain value (0.2 mm).

FIG. 10 is a graph showing a relationship between the thickness in nm of the dielectric layer and an effective refractive index, depending on the presence or absence of the outer covering. The effective refractive index is a parameter that represents an average refractive index of the medium contributing to the electromagnetic wave transmission and characterizes the transmission state of the electromagnetic waves.

If the outside surface of the dielectric layer of the hollow waveguide tube is covered with a foamed resin, as shown by a dot-dashed line in FIG. 10, the effective refractive index asymptotically approaches the refractive index of the foamed resin (1.016) (in the case of foamed polystyrene having an expansion ratio of approximately 30 times) as the thickness of the dielectric layer decreases (dielectric tube becomes thinner). This indicates that the propagation medium of the electromagnetic waves shifts from the dielectric to the foamed resin as the thickness of the dielectric layer decreases. The transmission with the foamed resin as the propagation medium is unstable in terms of the confinement of the electromagnetic waves, and eventually becomes incapable of transmission.

In contrast, if the outside surface of the foamed resin is covered with the metal film, as shown by a solid line in FIG. 10, the effective refractive index does not asymptotically approach the refractive index of the foamed resin, but the effective refractive index decreases with the decreasing thickness of the dielectric layer. This indicates that the propagation medium of the electromagnetic waves does not shift to the foamed resin and the electromagnetic waves are stably transmitted with the dielectric layer (dielectric tube) as the waveguide.

As described above, in the electromagnetic wave transmission cable 200 according to the present embodiment, the outer covering of the hollow waveguide tube 10 has a double structure including the foamed resin member 20 and the metal film 50. This can suppress a drop in the transmission loss occurring if the covering is the foamed resin alone. More specifically, if the dielectric layer of the hollow waveguide tube is covered with only the foamed resin, electromagnetic wave transmission can no longer be transmitted once the transmission loss falls below a lower limit value determined by the physical property values of the dielectric waveguide and the foamed resin (for example, the effective refractive index falls below the refractive index of the foamed resin). However, if the foamed resin (foamed resin member 20) is further covered with the metal film as in the present embodiment, transmission losses below the lower limit value (lower limit value of the transmission loss in the case of covering with only the foamed resin) can be achieved.

In the electromagnetic wave transmission cable 200 according to the present embodiment, the metal film 50 functions as a shield against external electromagnetic waves (i.e. noise). Since the hollow waveguide tube 10 is shielded from outside effects, electromagnetic waves can be stably transmitted.

The thickness of the entire covering portion can be reduced for miniaturization, compared to when the hollow waveguide tube is covered with only a foamed resin.

The metal film 50 does not necessarily need to cover the entire outside surface of the foamed resin member 20. For example, the metal film 50 may be patterned to partly cover the outside surface of the foamed resin member 20 at intervals less than or equal to the wavelength of the electromagnetic waves EW. The patterning of the metal film may be implemented, for example, by a method of winding a metal thin wire or a method of putting a net such as a braided shield. The patterning of the metal film may be implemented by forming a wire grid or a metamaterial structure by using a mask during film formation.

The needed thickness of the foamed resin member 20 can be reduced by adjusting the structures and materials of the dielectric waveguide 10 and the metal film 50.

While the metal film 50 is described to be made of a metal such as gold, silver, and copper, the metal film 50 may be made of aluminum or an alloy. The metal constituting the metal film 50 desirably has a high conductivity, whereas any metal having some conductivity can be used since even a metal having a low conductivity has the effect of improving the transmission characteristic.

Figure 8C:
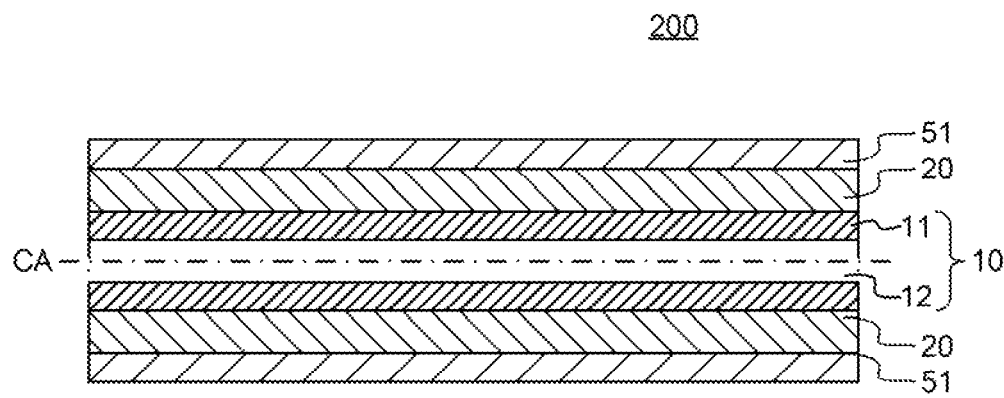

Instead of the metal film 50, a dielectric film 51 may be used as the outer coating that covers the foamed resin member 20, as shown in FIG. 8C. For example, a dielectric film having a refractive index of about 1.4 or more can provide a sufficient refractive index difference at the interface.

The electromagnetic wave transmission cable according to the present embodiment can be used, for example, as a cable for in-vehicle high capacity high speed information communication to replace a vehicle information harness of an automobile and the like, or as a cable intended for a data center, moving image transmission, and the like where high capacity communication is needed.

The invention claimed is:

1. An electromagnetic wave transmission cable for transmitting an electromagnetic wave, comprising:
a hollow waveguide tube including a hollow dielectric layer formed in a tubular shape; and
a foamed resin member that is provided over a predetermined length in a longitudinal direction of the hollow waveguide tube and covers a surface of the dielectric layer to surround an outer periphery of the hollow waveguide tube,
wherein the foamed resin member has different expansion ratios between a region of the foamed resin member close to a contact surface of the foamed resin member that is in contact with the dielectric layer and a region of the foamed resin member far from the contact surface.

2. The electromagnetic wave transmission cable according to claim 1, wherein the foamed resin member has a rotationally symmetrical sectional shape about a center axis of the hollow waveguide tube.

3. The electromagnetic wave transmission cable according to claim 1, wherein the dielectric layer is made of a dielectric containing a material having stretch porosity.

4. The electromagnetic wave transmission cable according to claim 1, wherein the different expansion ratios within the foamed resin member have a high expansion ratio in the region close to the contact surface and a low expansion ratio in the region far from the contact surface.

5. The electromagnetic wave transmission cable according to claim 1, wherein the contact surface of the foamed resin member covers the surface of the dielectric layer at a plurality of positions in the longitudinal direction of the hollow waveguide tube.

6. The electromagnetic wave transmission cable according to claim 1, wherein the contact surface of the foamed resin member includes a protruding structure on an inner surface thereof that is in contact with the dielectric layer.

7. The electromagnetic wave transmission cable according to claim 1, wherein the foamed resin member includes a protruding structure on an outside surface thereof opposite from the contact surface.

8. The electromagnetic wave transmission cable according to claim 1, further comprising an outer coating that covers an outside surface of the foamed resin member along the longitudinal direction of the hollow waveguide tube and the foamed resin member.

9. The electromagnetic wave transmission cable according to claim 8, wherein the outer coating is a dielectric.

10. The electromagnetic wave transmission cable according to claim 8, wherein the outer coating is a metal film.

11. The electromagnetic wave transmission cable according to claim 10, further comprising a protective film that covers an outside surface of the outer coating along the longitudinal direction of the hollow waveguide tube.

12. The electromagnetic wave transmission cable according to claim 11, wherein the protective film is made of a material containing a dielectric material.

13. The electromagnetic wave transmission cable according to claim 1, wherein the foamed resin member is made of any one of foamed polystyrene, foamed polyurethane, foamed polyolefin, and foamed polytetrafluoroethylene.

14. The electromagnetic wave transmission cable according to claim 1, wherein the foamed resin member is made of the same material as that of the dielectric layer.

15. The electromagnetic wave transmission cable according to claim 1, wherein the electromagnetic wave has a frequency of 30 to 100000 GHz.

16. The electromagnetic wave transmission cable according to claim 1, wherein the foamed resin member has an average refractive index of 1 or more and not more than 1.4 in a transmission frequency band of the electromagnetic wave.

17. The electromagnetic wave transmission cable according to claim 1, wherein the foamed resin member covering the dielectric layer has a thickness greater than or equal to an equivalent wavelength expressed by a wavelength of the electromagnetic wave multiplied by an average refractive index of the foamed resin member.

18. The electromagnetic wave transmission cable according to claim 1, wherein the foamed resin member has an average attenuation factor of 0.1 cm$^{-1}$ or less with respect to the electromagnetic wave.

19. The electromagnetic wave transmission cable according to claim 1, wherein the hollow waveguide tube has an outer diameter greater than or equal to an equivalent wavelength expressed by a wavelength of the electromagnetic wave multiplied by a refractive index of the dielectric layer.

* * * * *